United States Patent
Kim

(10) Patent No.: US 9,820,385 B2
(45) Date of Patent: Nov. 14, 2017

(54) MOUNTING DEVICE FOR MOUNTING MULTI-SEGMENTED FLEXIBLE PRINTED CIRCUIT BOARD ON A CIRCULAR DISPLAY SUBSTRATE

(71) Applicant: SAMSUNG DISPLAY CO., LTD., Yongin-si, Gyeonggi-do (KR)

(72) Inventor: Joon-Sam Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 278 days.

(21) Appl. No.: 14/286,890

(22) Filed: May 23, 2014

(65) Prior Publication Data
US 2015/0201503 A1    Jul. 16, 2015

(30) Foreign Application Priority Data
Jan. 14, 2014   (KR) .................. 10-2014-0004357

(51) Int. Cl.
  *H05K 3/30*   (2006.01)
  *H05K 1/18*   (2006.01)
  *H05K 1/14*   (2006.01)

(52) U.S. Cl.
  CPC ............ *H05K 1/189* (2013.01); *H05K 1/147* (2013.01); *H05K 2201/056* (2013.01); *H05K 2201/09027* (2013.01); *H05K 2201/10681* (2013.01); *H05K 2203/082* (2013.01); *H05K 2203/166* (2013.01); *Y10T 29/49126* (2015.01); *Y10T 29/53183* (2015.01)

(58) Field of Classification Search
CPC .. H05K 1/147; H05K 1/189; H05K 2201/056; H05K 2201/09027; H05K 2201/10681
See application file for complete search history.

(56) References Cited

U.S. PATENT DOCUMENTS

| | | | | |
|---|---|---|---|---|
| 4,830,079 | A * | 5/1989 | Onuma ................ | B60C 25/135 157/1.24 |
| 5,433,810 | A * | 7/1995 | Abrams .............. | B29C 65/7841 156/272.2 |
| 6,640,423 | B1 * | 11/2003 | Johnson ........... | H01L 21/67144 29/721 |
| 7,357,288 | B2 * | 4/2008 | Hosotani ............... | B23K 3/087 219/444.1 |
| 8,215,005 | B2 * | 7/2012 | Hiraki .............. | H01L 21/67144 29/739 |

(Continued)

FOREIGN PATENT DOCUMENTS

| JP | 2006-147766 A | 6/2006 |
|---|---|---|
| KR | 10-2005-0013367 A | 2/2005 |

(Continued)

*Primary Examiner* — Minh Trinh
(74) *Attorney, Agent, or Firm* — Lewis Roca Rothgerber Christie LLP

(57) ABSTRACT

A mounting device for mounting a multi-segmented flexible printed circuit board includes: a circular stage on which a display substrate provided with a plurality of sub-pads and a multi-segmented flexible printed circuit board attached to a side of the display substrate are configured to be placed; and a pressing unit arranged adjacent to the circular stage and configured to press and attach the multi-segmented flexible printed circuit board to the plurality of sub-pads of the display substrate.

9 Claims, 7 Drawing Sheets

(56) References Cited

U.S. PATENT DOCUMENTS

2005/0076498 A1* 4/2005 Mizuno .............. H05K 13/0413
　　　　　　　　　　　　　　　　　　　　　29/740
2008/0073324 A1* 3/2008 Nogami ............ H01L 21/02087
　　　　　　　　　　　　　　　　　　　　　216/58
2011/0099804 A1　5/2011 Hamada et al.

FOREIGN PATENT DOCUMENTS

| KR | 10-2011-0036788 A | 4/2011 |
| KR | 10-2012-0042437 A | 5/2012 |
| KR | 10-2013-0004012 A | 1/2013 |

* cited by examiner

MOUNTING DEVICE FOR MOUNTING MULTI-SEGMENTED FLEXIBLE PRINTED CIRCUIT BOARD ON A CIRCULAR DISPLAY SUBSTRATE

CROSS-REFERENCE TO RELATED APPLICATION

This application claims priority to and the benefit of Korean Patent Application No. 10-2014-0004357, filed on Jan. 14, 2014 in the Korean Intellectual Property Office, the entire content of which is incorporated herein by reference.

BACKGROUND

1. Field

Aspects of embodiments of the present invention relate to a mounting device for mounting a flexible printed circuit board on a display substrate, and a method of mounting the same.

2. Description of the Related Art

A display includes a display substrate made up of a plurality of pixels provided in a domain defined by a black matrix or a pixel defining layer. Displays are classified into liquid crystal displays (LCDs), plasma display panels (PDPs), organic light-emitting diode displays (OLEDs), and the like, according to the kinds of display substrates.

A display substrate generally has a quadrangular shape, and includes a display area for displaying an image, and a non-display area located at the edge of the display area. The display area includes a plurality of pixels arranged in the form of a matrix, and the plurality of pixels receive data signals, scan signals, and drive voltages through data lines, scan lines, and power supply lines provided in the non-display area, respectively.

Further, the non-display area may be provided at one side thereof with a pad for mounting a flexible printed circuit board such as flexible printed circuit (FCP), chip on film (COF), tape carrier package (TOP), or the like.

Recently, design demands for circular display substrates, such as for watch type products, have increased. However, when a general type of pad is applied to such a circular display substrate, the pad protrudes from the circular display substrate, such that the circular display substrate cannot be a perfectly circular display substrate. When a circular display substrate is provided with a plurality of pads arranged at regular intervals, the pads do not protrude from the circular display substrate.

Further, in order to manufacture a circular display substrate provided with a plurality of pads, the plurality of pads must be connected to a multi-segmented flexible printed circuit board. However, since a conventional mounting device is a device for mounting a flexible printed circuit board on a quadrangular display substrate, it has a unidirectionally aligned and pressed structure.

SUMMARY

According to aspects of embodiments of the present invention, a mounting device for mounting a multi-segmented flexible printed circuit board on a circular display substrate provided with a plurality of pads, and a method of mounting the same are provided.

According to an embodiment of the present invention, a mounting device for mounting a flexible printed circuit board includes: a circular stage on which a display substrate provided with a plurality of sub-pads and a multi-segmented flexible printed circuit board attached to a side of the display substrate are configured to be placed; and a pressing unit arranged adjacent to the circular stage and configured to press and attach the multi-segmented flexible printed circuit board to the plurality of sub-pads of the display substrate.

The circular stage may include at least one suction hole configured to fix the display substrate and the flexible printed circuit board to the circular stage.

The circular stage may be rotatable about a central axis thereof.

The pressing unit may be rotatable along a circumference of the circular stage.

The pressing unit may include: a pressing part configured to press the flexible printed circuit board to the sub-pads of the display substrate; a driving part configured to ascend and descend the pressing part; and a supporting part configured to support at least one of the pressing part and the driving part.

The mounting device may further include an imaging unit (e.g. a photographing unit) configured to align the pressing unit and the sub-pads of the display substrate.

The mounting device may further include a processing unit configured to process an end portion of the multi-segmented flexible printed circuit board in a predetermined shape.

The processing unit may be a bending jig.

The processing unit may be a pre-forming jig.

According to another embodiment of the present invention, a method of mounting a flexible printed circuit board includes: attaching a multi-segmented flexible printed circuit board to a side of a display substrate provided with a plurality of pads; placing the display substrate having the multi-segmented flexible printed circuit board attached thereto on a circular stage; aligning the pads of the display substrate with a pressing unit by rotating the circular stage; processing an end portion of the multi-segmented flexible printed circuit board in a predetermined shape; and pressing and attaching the multi-segmented flexible printed circuit board to the pads of the display substrate using the pressing unit.

The processing the end portion of the multi-segmented flexible printed circuit board may be performed using a bending jig.

The processing the end portion of the multi-segmented flexible printed circuit board may be performed using a pre-forming jig.

According to aspects of embodiments of the present invention, a device for mounting a multi-segmented flexible printed circuit board and a method of mounting the same enable a multi-segmented flexible printed circuit board to be effectively mounted on a display substrate provided with a plurality of pads.

The foregoing summary is illustrative only and is not intended to be in any way limiting of aspects of embodiments of the present invention. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION

Figure 1:
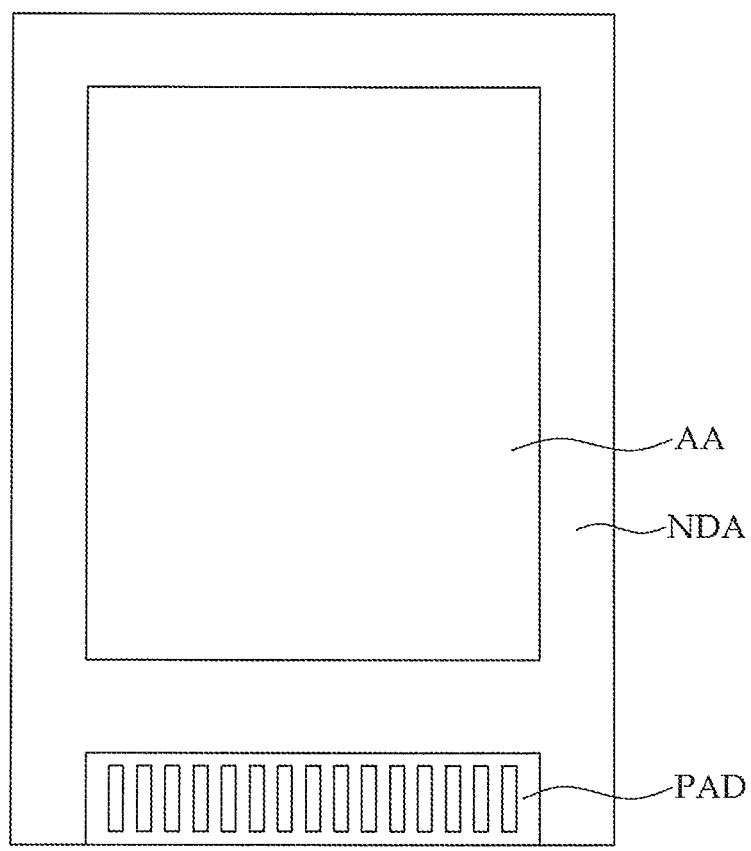
FIG. 1 is a schematic plan view of a general type of a conventional display substrate.

Aspects and features of the present invention and methods for achieving them will be made clear from some embodiments of the present invention described below with reference to the accompanying drawings. The present invention may, however, be embodied in many different forms and should not be construed as being limited to the embodiments set forth herein. Rather, these embodiments are provided so as to convey the scope of the invention to those skilled in the art. As those skilled in the art would realize, the described embodiments may be modified in various different ways, all without departing from the spirit or scope of the present invention. Accordingly, the drawings and description are to be regarded as illustrative in nature and not restrictive. Well-known constituent elements, operations, and techniques may not be described in detail herein. Like reference numerals refer to like elements throughout the specification.

Spatially relative terms, such as "below," "beneath," "lower," "above," "upper," and the like, may be used herein for purposes of description to describe the relations between one element or component and another element or component as illustrated in the drawings. It will be understood that the spatially relative terms are intended to encompass different orientations of the device in use or operation, in addition to the orientations depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular embodiments only and is not to be construed as limiting the invention. As used herein, the singular forms "a," "an," and "the" are intended to include the plural forms as well, unless the context clearly indicates otherwise. It will be further understood that the terms "comprises" and/or "comprising," when used in this specification, specify the presence of a mentioned component, step, operation and/or element, but do not exclude the presence or addition of one or more other components, steps, operations and/or elements.

Unless otherwise defined, all terms used herein (including technical and scientific terms) have the same meaning as commonly understood by those skilled in the art to which this invention pertains.

Hereinafter, some embodiments of the present invention are described in further detail with reference to the drawings.

FIG. 1 is a schematic plan view of a general type of a conventional display substrate.

Generally, a conventional display substrate has a quadrangular shape, and includes a display area or active area (AA) for displaying an image and a non-display area (NDA) located at the edge of the active area (AA). The active area (AA) includes a plurality of pixels arranged in the form of a matrix, and the plurality of pixels can be driven through various kinds of lines provided in the non-display area (NDA). Further, a pad (PAD) may be disposed at one side of the non-display area (NDA) to be configured to mount various kinds of parts for applying various drive signals to the active area (AA).

Parts mounted on the pad (PAD) of a display substrate may include flexible printed circuit boards, such as flexible printed circuit (FPC), chip on film (COF), tape carrier package (TCP), and the like.

Figure 2:
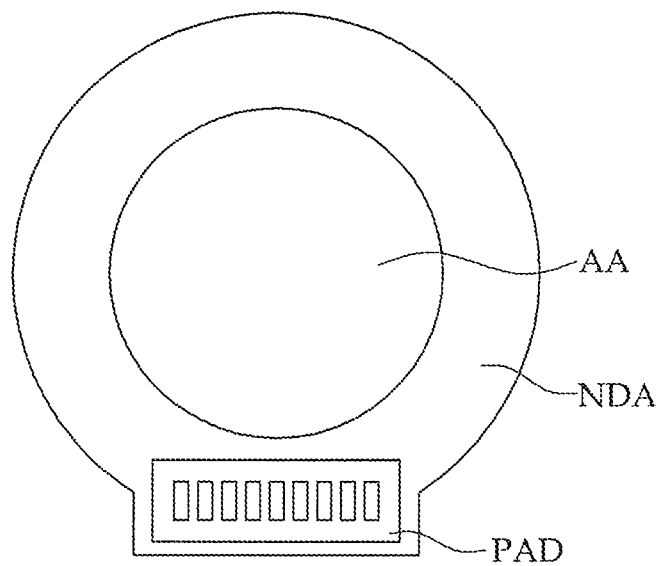
FIG. 2 is a schematic plan view of a circular display substrate provided with a conventional pad.

Recently, design demands for circular display substrates, such as for watch type products, have increased. However, as shown in FIG. 2, when a general type of pad (PAD) is applied to such a circular display substrate, the pad (PAD) protrudes from the circular display substrate, such that the circular display substrate cannot be a perfectly circular display substrate.

Figure 3:
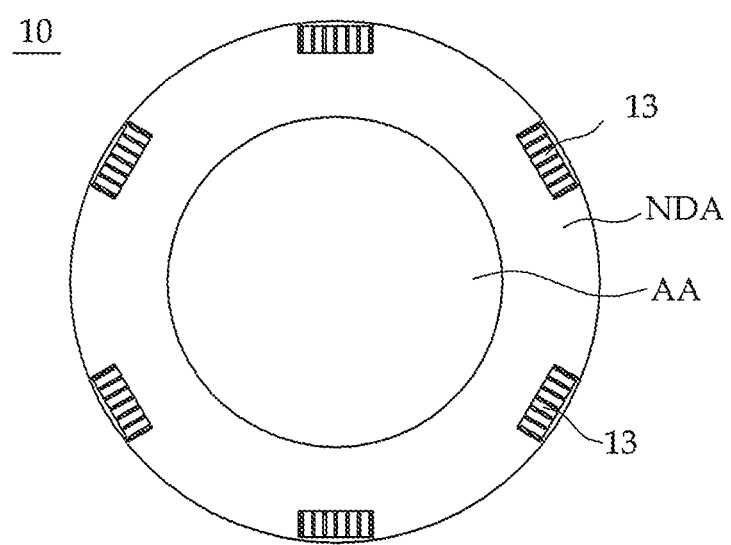
FIG. 3 is a schematic plan view of a circular display substrate provided with a plurality of sub-pads.

FIG. 3 is a schematic plan view of a circular display substrate provided with a plurality of sub-pads.

Referring to FIG. 3, a circular display substrate 10 includes a plurality of sub-pads 13 arranged at intervals (e.g., regular intervals) along a circumference thereof. It is shown in FIG. 3 that a pad may be divided into six sub-pads 13; however, the present invention is not limited thereto. The number, interval, position, and the like, of the sub-pads 13 may be variously changed.

Figure 4:
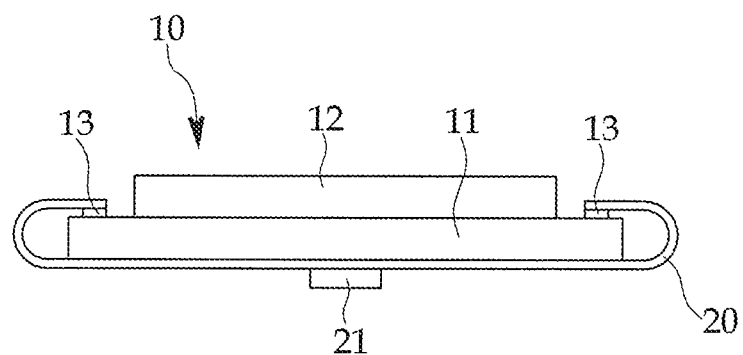
FIG. 4 is a cross-sectional view of a circular display substrate mounted with a multi-segmented flexible printed circuit board.
Figure 5:
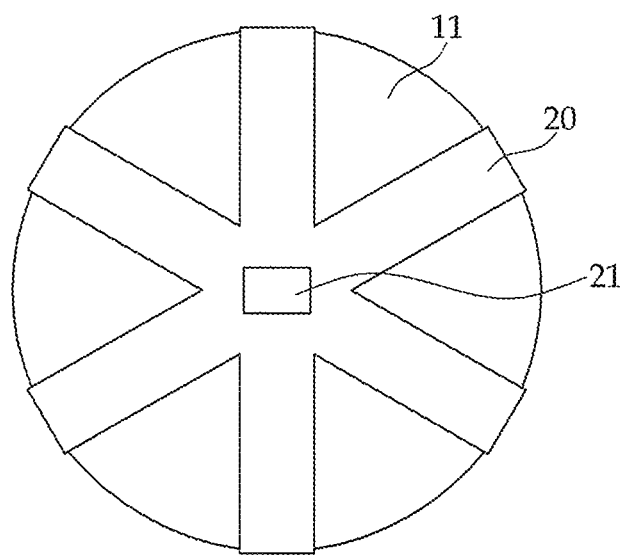
FIG. 5 is a view of a rear side of the circular display substrate mounted with a multi-segmented flexible printed circuit board of FIG. 4.

FIG. 4 is a cross-sectional view of a circular display substrate mounted with a multi-segmented flexible printed circuit board; and FIG. 5 is a view of a rear side of the circular display substrate mounted with a multi-segmented flexible printed circuit board shown in FIG. 4.

Referring to FIGS. 4 and 5, a multi-segmented flexible printed circuit board 20 may be mounted on a circular display substrate 10 provided with a plurality of pads 13.

The circular display substrate 10 may be one of a liquid crystal display substrate, a plasma display substrate, or an organic light-emitting display substrate, for example, and may include a lower substrate 11 and an upper substrate 12.

The multi-segmented flexible printed circuit board 20 may be a COF (chip on film) provided at the center of the circular display substrate 10 with a driver integrated circuit 21. As shown in FIG. 5, the multi-segmented flexible printed circuit board 20 has a plurality of radially-extended segments.

A conventional mounting device has a unidirectionally aligned and compacted structure in order to mount a flexible printed circuit board on a quadrangular display substrate.

According to embodiments of the present invention, a mounting device for mounting the multi-segmented flexible printed circuit board 20 on the circular display substrate 10 provided with a plurality of sub-pads and a method of mounting the same are provided.

Figure 6:
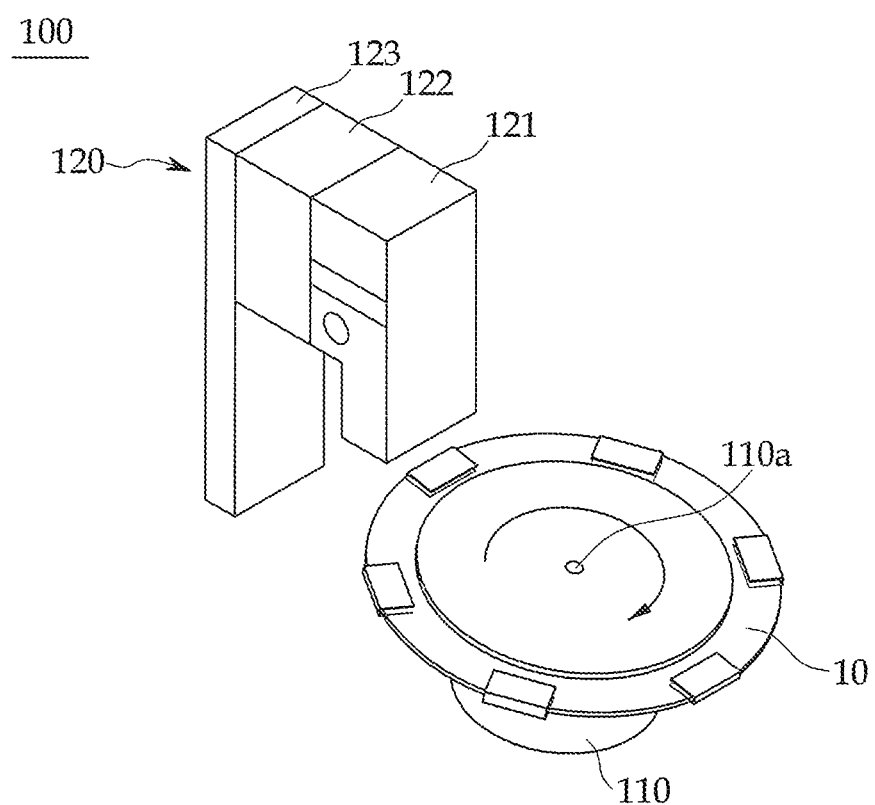
FIG. 6 is a schematic perspective view of a mounting device for mounting a multi-segmented flexible printed circuit board, according to an embodiment of the present invention.
Figure 7:
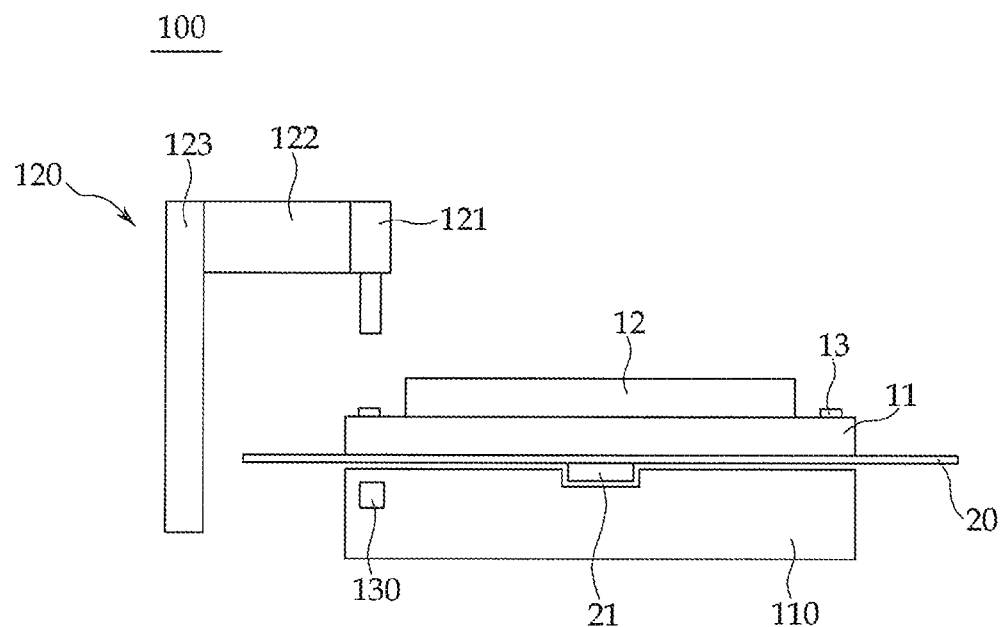
FIG. 7 is a schematic cross-sectional view of a mounting device for mounting a multi-segmented flexible printed circuit board, according to an embodiment of the present invention.

FIG. 6 is a schematic perspective view of a mounting device for mounting a multi-segmented flexible printed circuit board, according to an embodiment of the present invention; and FIG. 7 is a schematic cross-sectional view of a mounting device for mounting a multi-segmented flexible printed circuit board, according to an embodiment of the present invention.

Referring to FIGS. 6 and 7, a mounting device 100 for mounting a multi-segmented flexible printed circuit board according to an embodiment of the present invention includes: a circular stage 110 on which a circular display substrate 10 provided with a plurality of sub-pads 13 and a multi-segmented flexible printed circuit board 20 attached to the rear side of the circular display substrate 10 are placed; and a pressing unit 120 which is disposed adjacent to the circular stage 110 and which is configured to press and attach the multi-segmented flexible printed circuit board 20 to the plurality of sub-pads 13 of the circular display substrate 10.

In one embodiment, the circular stage 110 rotates about a central axis 110a by a drive motor, for example, to cause angular displacement. The degree of angular displacement may be determined depending on the position of the sub-pads 13 of the circular display substrate 10. In another embodiment, the circular stage 110 may be fixed, and the pressing unit 120 may rotate along a circumference of the circular stage 110.

In one embodiment, for example, six sub-pads 13 may be arranged on the circular display substrate 10, as shown in FIG. 3, and the circular stage 110 may rotate about the central axis 110a at an angular displacement of about 60°.

Figure 8:
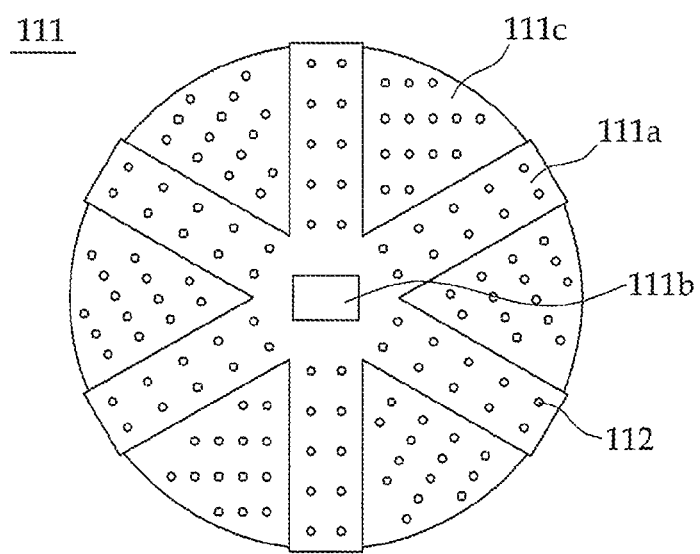
FIG. 8 is a schematic plan view of an upper side of a circular stage, according to an embodiment of the present invention.

As shown in FIG. 8, in one embodiment, the circular stage 110 may be provided on an upper side 111 thereof with a multi-segmented flexible printed circuit board placing portion 111a, a driver integrated circuit placing portion 111b, and a circular display substrate placing portion 111c.

That is, in one embodiment, the circular display substrate 10 may be placed on the upper side 111 of the circular stage 110 while being provided on the rear side thereof with the multi-segmented flexible printed circuit board 20, and the upper side 111 of the circular stage 110 may have a same or corresponding structure as the rear side of the circular display substrate 10 provided with the multi-segmented flexible printed circuit board 20.

A loader or an industrial robot, for example, may be generally used to place the circular display substrate 10 on the upper side 111 of the circular stage 110, or a worker may directly place the circular display substrate 10 on the upper side 111 of the circular stage 110.

In one embodiment, the circular stage 110 may be provided with a plurality of suction holes 112. During a mounting process, the circular stage 110 can fix the circular display substrate 10 and the multi-segmented flexible printed circuit board 20 on the upper side 111 thereof by sucking air through the suction holes 112. As a fixing device, a jig or a clamp may be used in addition to the suction holes 112, or instead of the suction holes 112.

The pressing unit 120 may be disposed adjacent to the circular stage 110. It is shown in FIGS. 6 and 7 that the mounting device 100 for mounting a flexible printed circuit board includes one pressing unit 120. However, according to another embodiment of the present invention, the mounting device 100 may include a plurality of pressing units 120.

Referring to FIG. 7, in one embodiment, the pressing unit 120 includes a pressing part 121 configured to press the flexible printed circuit board 20 aligned on the sub-pads 13 of the circular display substrate 10 to attach the flexible printed circuit board 20 to the circular display substrate 10; a driving part 122 configured to ascend and descend the pressing part 121; and a supporting part 123 configured to support the driving part 122.

The pressing part 121 presses the flexible printed circuit board 20 aligned on the sub-pads 13 of the circular display substrate 10 to attach the flexible printed circuit board 20 to the circular display substrate 10. The pressing part 121, in one embodiment, may have a bar shape which is the same as that of the sub-pad 13 of the circular display substrate 10. The pressing part 121, in one embodiment, may further include a heating source (not shown) for performing thermal pressing.

The driving part 122 is connected with the pressing part 121 to ascend or descend the pressing part 121. The driving part 122, in one embodiment, may be provided with a reciprocating pneumatic cylinder.

The supporting part 123 supports at least one of the pressing part 121 and the driving part 122. The supporting part 123 may be fixed adjacent to the circular stage 110 or may rotate along the circumference of the circular stage 110.

The mounting device 100 for mounting a multi-segmented flexible printed circuit board according to an embodiment of the present invention may further include an imaging unit 130 configured to align the pressing unit 120 and the sub-pads 13 of the circular display substrate 10.

The imaging unit 130 may be provided at one side of the circular stage 110 or the pressing unit 120. The imaging unit 130, in one embodiment, is configured to recognize an alignment mark of at least one of the circular display substrate 10 or the flexible printed circuit board 20. As such, it may be ascertained whether or not the sub-pads 13 of the circular display substrate 10 are aligned with the pressing unit 120 by the imaging unit 130.

The mounting device 100 for mounting a multi-segmented flexible printed circuit board according to an embodiment of the present invention may further include a processing unit (not shown) configured to process an end portion of the flexible printed circuit board 20, namely a portion thereof being attached to the sub-pads 13 of the circular display substrate 10, in a shape (e.g., a predetermined shape). In one embodiment, the processing unit (not shown) may be a bending jig or a pre-forming jig.

Figure 9:
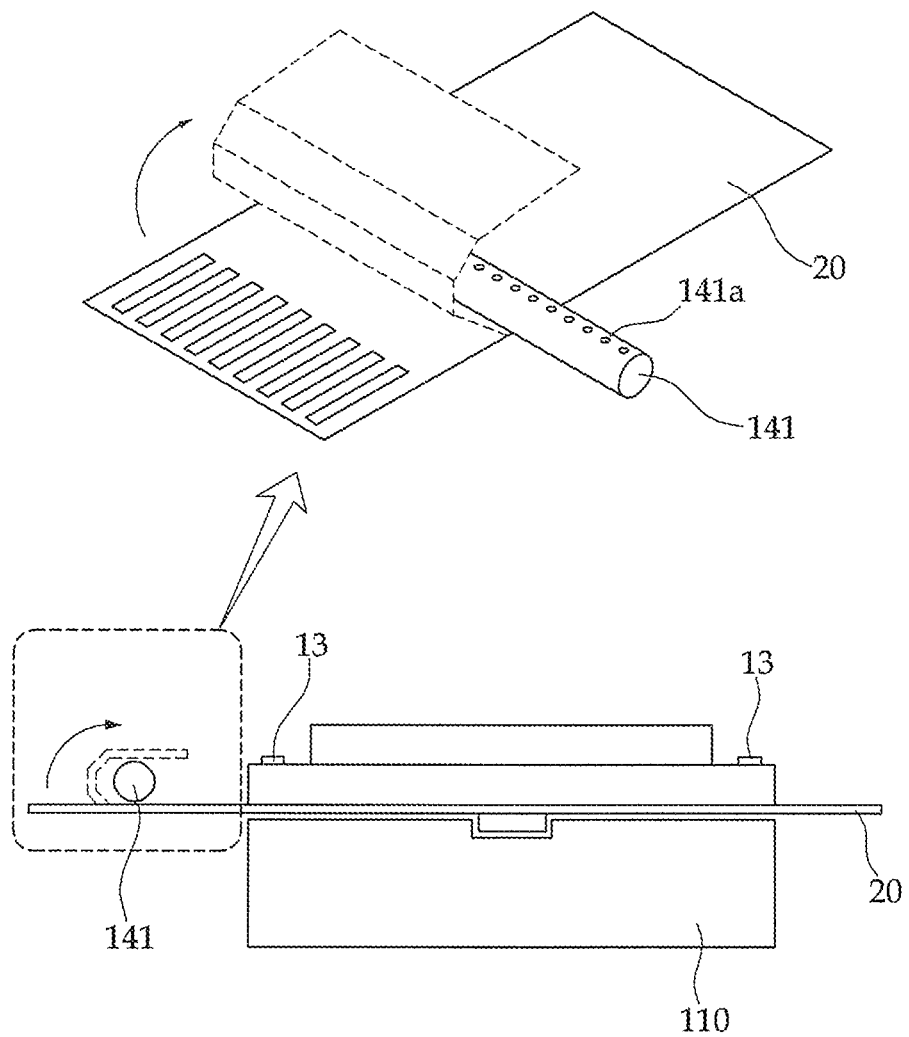
FIG. 9 is a schematic view illustrating a method of processing an end portion of a multi-segmented flexible printed circuit board using a bending jig, according to an embodiment of the present invention.

FIG. 9 is a schematic view illustrating a method of processing an end portion of the multi-segmented flexible printed circuit board 20 using a bending jig.

Referring to FIG. 9, in one embodiment, a bending jig 141 is provided with vacuum holes 141a to apply a suction force to the flexible printed circuit board 10, and may have a bar shape so as to have forward, backward, and rotation movement. As such, the bending jig 141 is configured to dispose an end portion of the multi-segmented flexible printed circuit board 20 on a respective one of the sub-pads 13 of the circular display substrate 10 by applying the suction force and then rotating the end portion thereof.

Figure 10:
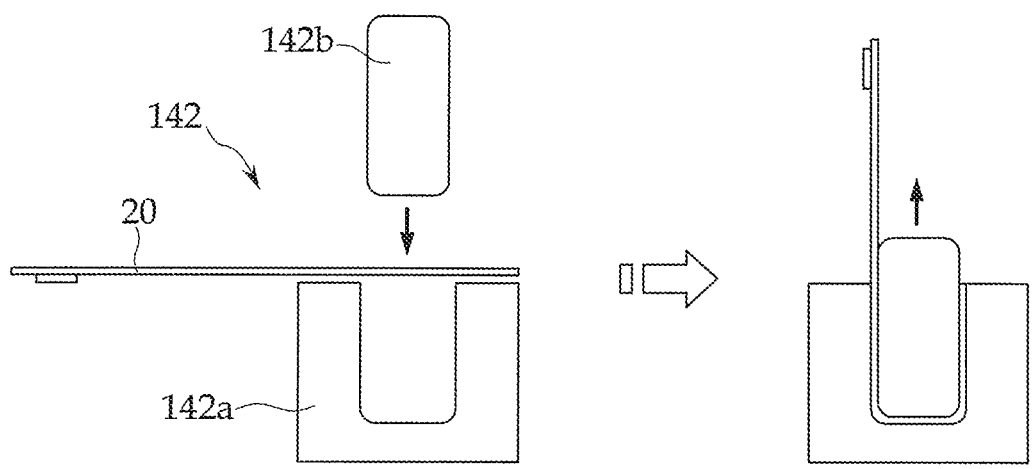
FIG. 10 is a schematic view illustrating a method of processing an end portion of a multi-segmented flexible printed circuit board using a pre-forming jig, according to an embodiment of the present invention.

FIG. 10 is a schematic view illustrating a method of processing an end portion of a multi-segmented flexible printed circuit board 20 using a pre-forming jig.

Referring to FIG. 10, in one embodiment, a pre-forming jig 142 includes a lower mold 142a and an upper mold 142b configured to form an end portion of the flexible printed circuit board 20 into a U-shaped end portion. The end portion of the flexible printed circuit board 20 is placed on the lower mold 142a, and the upper mold 142b reciprocates up and down, thereby forming the end portion of the flexible printed circuit board 20 on the lower mold 142a into a U-shaped end portion. Alternatively, the end portion of the flexible printed circuit board 20 may be placed on the upper mold 142a, and the lower mold 142b may reciprocates up and down, or both the upper mold 142a and the lower mold 142b may reciprocate up and down.

The bending jig 141 and the pre-forming jig 142 serve to process the end portion of the flexible printed circuit board 20 before the mounting of the flexible printed circuit board 20 to the sub-pads 13.

Hereinafter, a method of mounting a flexible printed circuit board using a mounting device according to an embodiment of the present invention is described in further detail.

According to an embodiment of the present invention, a method of mounting a flexible printed circuit board includes tasks of: (S1) attaching the multi-segmented flexible printed circuit board 20 to the rear side of the circular display substrate 10; (S2) placing the circular display substrate 10 having the multi-segmented flexible printed circuit board 20 attached thereto on the circular stage 110; (S3) aligning the sub-pads 13 of the circular display substrate 10 with the pressing unit 120; (S4) processing the end portion of the multi-segmented flexible printed circuit board 20 in a shape (e.g., a predetermined shape); and (S5) pressing and attaching the end portion of the multi-segmented flexible printed circuit board 20 to the sub-pads 13 of the circular display substrate 10 using the pressing unit 120. In one embodiment, the task (S4) of processing the end portion of the multi-segmented flexible printed circuit board 20 may be carried out by using a bending jig or a pre-forming jig.

In the task (S1), the multi-segmented flexible printed circuit board 20, in one embodiment, may be attached to the rear side of the circular display substrate 10 by using a transparent adhesive, such as an optically clear adhesive (OCA), an optically clear resin (OCR), or the like. In this case, the multi-segmented flexible printed circuit board 20 may be attached to a lower region of the circular display substrate 10 below the sub-pads 13.

In the task (S2), the circular display substrate 10 having the multi-segmented flexible printed circuit board 20 attached thereto is placed on the upper side 111 of the circular stage 110. This task may be performed by using a loader or an industrial robot, for example, or a worker may directly place the circular display substrate 10 on the upper side 111 of the circular stage 110.

In the task (S3), in one embodiment, respective ones of the sub-pads 13 of the circular display substrate 10 are aligned in turn with a lower part of the pressing unit 120 by using the drive motor and imaging unit 130 provided in the circular stage 110.

In the task (S4), the respective end portions of the multi-segmented flexible printed circuit board 20 are processed in a shape (e.g., a predetermined shape) by using the bending jig 141 or the pre-forming jig 142 such that the subsequent attaching process may be easily conducted.

In one embodiment, the bending jig 141 is used, and the end portion of the multi-segmented flexible printed circuit board 20 is held via suction by using the vacuum holes 141a of the bending jig 141, and is then disposed on a respective one of the sub-pads 13 of the circular display substrate 10 by rotating the bending jig 141.

In another embodiment, the pre-forming jig 142 is used, and the end portion of the flexible printed circuit board 20 is placed on one of the lower mold 142a or the upper mold 142b that is in a fixed state, and then the other of the upper mold 142b or the lower mold 142a reciprocates up and down, thereby forming the end portion of the flexible printed circuit board 20 into a U-shaped end portion.

In the case of using the pre-forming jig 142, the step of processing the end portion of the flexible printed circuit board 20 may be carried out prior to the attaching task (S1), and then the following tasks may be conducted.

In the task of processing the end portion of the flexible printed circuit board 20 using the bending jig 141 or the pre-forming jig 142, the end portion of the flexible printed circuit board 20 may be processed temporarily before the mounting of the flexible printed circuit board 20.

In the task (S5), the respective end portions of the multi-segmented flexible printed circuit board 20 are attached to the sub-pads 13 of the circular display substrate 10 by using the pressing unit 120. In one embodiment, an anisotropic conductive film (AFC) is interposed between the flexible printed circuit board 20 and the sub-pads 13 of the circular display substrate 10, and is then pressed by the pressing part 121 of the pressing unit 120, thereby connecting the sub-pads 13 of the circular display substrate 10 with the flexible printed circuit board 20.

After the task (S5), the previous tasks may be repeatedly carried out with respect to another sub-pad 13 of the circular display substrate 10 by rotating the circular stage 110.

As described above, when the mounting device and method for mounting a multi-segmented flexible printed circuit board according to embodiments of the present invention are used, a multi-segmented flexible printed circuit board can be efficiently mounted on a display substrate provided with a plurality of pads.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the true scope and spirit being indicated by the following claims, and equivalents thereof. Therefore, it is to be understood that the foregoing is illustrative of various example embodiments and is not to be construed as limited to the specific example embodiments disclosed, and that modifications to the disclosed example embodiments are intended to be included within the scope of the appended claims and equivalents thereof.

What is claimed is:

1. A mounting device for mounting a multi-segmented flexible printed circuit board, comprising:
   a circular stage comprising an upper side on which a display substrate provided with a plurality of sub-pads and a multi-segmented flexible printed circuit board attached to a side of the display substrate are configured to be placed, wherein the upper side comprises a display substrate placing portion and a multi-segmented flexible printed circuit board placing portion including a plurality of sections extending from a central region of the circular stage to a perimeter of the circular stage, the multi-segmented flexible printed circuit board placing portion being recessed from the display substrate placing portion and comprising at least one first suction hole configured to fix the multi-segmented flexible printed circuit board to the multi-segmented flexible printed circuit board placing portion; and a pressing unit arranged adjacent to the circular stage, said pressing unit comprising a pressing part configured to press and attach the multi-segmented flexible printed circuit board to the plurality of sub-pads of the display substrate, the pressing part being arranged over the upper side of the circular stage and within an outer perimeter of the upper side of the circular stage such that a region of the upper side of the circular stage proximate the outer perimeter supports the display substrate when the pressing part presses the multi-segmented flexible printed circuit board.

2. The mounting device of claim 1, wherein the display substrate placing portion comprises at least one second suction hole configured to fix the display substrate to the display substrate placing portion.

3. The mounting device of claim 1, wherein the circular stage is rotatable about a central axis of the circular stage.

4. The mounting device of claim 1, wherein the pressing unit is rotatable along a circumference of the circular stage.

5. The mounting device of claim 1, wherein the pressing unit further comprises:
   a driving part configured to ascend and descend the pressing part; and
   a supporting part configured to support at least one of the pressing part and the driving part.

6. The mounting device of claim 1, further comprising an imaging unit configured to align the pressing unit and the sub-pads of the display substrate.

7. The mounting device of claim 1, further comprising a processing unit configured to process an end portion of the multi-segmented flexible printed circuit board in a predetermined shape.

8. The mounting device of claim 7, wherein the processing unit is a bending jig.

9. The mounting device of claim 7, wherein the processing unit is a pre-forming jig.

* * * * *